United States Patent
Henzler et al.

(10) Patent No.: US 11,121,684 B2
(45) Date of Patent: Sep. 14, 2021

(54) METHOD AND APPARATUS FOR DIGITAL ENVELOPE TRACKING WITH DYNAMICALLY CHANGING VOLTAGE LEVELS FOR POWER AMPLIFIER

(71) Applicant: Apple Inc., Cupertino, CA (US)

(72) Inventors: Stephan Henzler, Munich (DE); Andreas Langer, Unterschleissheim (DE); Otto Schumacher, Dachau (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/765,668

(22) PCT Filed: Dec. 15, 2017

(86) PCT No.: PCT/US2017/066556
§ 371 (c)(1),
(2) Date: May 20, 2020

(87) PCT Pub. No.: WO2019/117933
PCT Pub. Date: Jun. 20, 2019

(65) Prior Publication Data
US 2020/0304082 A1    Sep. 24, 2020

(51) Int. Cl.
*H03F 1/30* (2006.01)
*H03F 3/24* (2006.01)
(Continued)

(52) U.S. Cl.
CPC .......... *H03F 3/245* (2013.01); *H03F 1/0227* (2013.01); *H03F 1/3241* (2013.01); *H03F 3/195* (2013.01);
(Continued)

(58) Field of Classification Search
CPC .................................... H03F 1/30; H03F 1/32
(Continued)

(56) References Cited

U.S. PATENT DOCUMENTS 6,191,653 B1 * 2/2001 Camp, Jr. ............. H03F 1/3241
                                                               330/129
7,898,327 B2 * 3/2011 Nentwig .................. H03F 1/32
                                                               330/149

(Continued)

OTHER PUBLICATIONS

International Search Report and Written Opinion in International Application No. PCT/US2017/066556, dated Sep. 17, 2018, 12 pgs.

*Primary Examiner* — Henry Choe
(74) *Attorney, Agent, or Firm* — Kowert, Hood, Munyon, Rankin & Goetzel, P.C.

(57) ABSTRACT

A device for digital envelope tracking with dynamically changing voltage levels for a radio frequency (RF) power amplifier is disclosed. A power management unit generates a set of supply voltages for a power amplifier based on a control signal. A setpoint generator in the power management integrated circuit gradually increases or decreases a target voltage such that the set of supply voltages output from the voltage converter gradually increase or decrease in response to a gradual transition of the target voltage. A transceiver includes digital models for replicating a behavior of the setpoint generator and a voltage regulator in the voltage converter such that a signal pre-distortion unit may use an instantaneous voltage level for signal predistortion.

20 Claims, 8 Drawing Sheets

(51) Int. Cl.
    *H03F 1/02*    (2006.01)
    *H03F 1/32*    (2006.01)
    *H03F 3/195*   (2006.01)
    *H04B 1/38*    (2015.01)

(52) U.S. Cl.
    CPC ......... *H04B 1/38* (2013.01); *H03F 2200/102* (2013.01); *H03F 2200/451* (2013.01); *H03F 2200/504* (2013.01)

(58) Field of Classification Search
    USPC .................................................. 330/297, 149
    See application file for complete search history.

(56) References Cited

U.S. PATENT DOCUMENTS

| | | | |
|---|---|---|---|
| 9,041,464 B2* | 5/2015 | Komninakis | ......... H03F 1/0244 330/149 |
| 2013/0072139 A1 | 3/2013 | Kang et al. | |
| 2015/0180421 A1 | 6/2015 | Balteanu et al. | |
| 2016/0087590 A1 | 3/2016 | Menegoli et al. | |
| 2016/0197627 A1 | 7/2016 | Qin et al. | |
| 2016/0294587 A1 | 10/2016 | Jiang et al. | |

* cited by examiner

METHOD AND APPARATUS FOR DIGITAL ENVELOPE TRACKING WITH DYNAMICALLY CHANGING VOLTAGE LEVELS FOR POWER AMPLIFIER

FIELD

Examples relate to a method and device for digital envelope tracking with dynamically changing voltage levels for a radio frequency (RF) power amplifier (PA).

BACKGROUND

In digital envelope tracking a set of discrete voltages is generated and one of them is forwarded to an RF power amplifier. The failure of the digital envelope tracking (compared to a perfect envelope tracking) may be compensated by RF signal pre-distortion.

The digital envelope tracker uses a predefined set of voltage levels that are connected to the power amplifier depending on the level of the RF envelope. In case of digital tracking the RF envelope is forward-looking analyzed to identify the number and height of peaks in next time interval, and depending on certain criteria a voltage level is selected. The number of voltage levels is a trade-off between total efficiency improvement and constraints imposed by the tracker design. A greater number of voltage levels improves the efficiency of the power amplifier but increases the complexity of the tracker. This complexity increase mainly comes from the fact that every level of voltages needs additional external capacitors on a printed circuit board (PCB).

Conventional solutions assume steady state conditions after a voltage change with a set of previously settled and constant voltage levels. This has drawbacks for mobile applications because the power level and therefore the levels of the set of voltages need to change frequently in mobile applications to improve the system efficiency, e.g. on a subframe to subframe basis. Output signal continuity is needed even during such voltage level transitions.

FIG. 1 shows conventional digital envelope tracking based on constant voltage levels. The piecewise constant level definition unit 104 in a transceiver 100 receives information regarding the configured mode of the RF front end (RFFE), information regarding the power level of the input data stream to be transmitted, and configuration and calibration information such as the PA loadline, or the like, and derives the voltage levels for a set of supply voltages needed for the power amplifier 120 based on this information. The piecewise constant level definition unit 104 determines each voltage value of the set of supply voltages for the power amplifier 120 and sends this information (control signal 111) to the power management integrated circuit (PMIC) 110 via the control unit 102.

A control unit 102 in a transceiver 100 analyzes characteristics of the RF envelope of an input data stream 130 and sends control signals 116 and 117 to the PMIC 110 and for digital voltage level selection, respectively. The piecewise constant generator 112 in the PMIC 110 outputs a target voltage to a single-input multiple-output (SIMO) DC-DC converter 114 based on the control signal 111. The DC-DC converter 114 generates a set of voltages and one of the set of voltages is switched to a power amplifier 120 based on the control signal 116 from the control unit 102. The set of voltages output from the DC-DC converter 114 remains constant until the target voltage changes.

The piecewise constant level definition unit 104 also generates a set of digital voltage levels and one of the set of digital voltage levels is switched to the RF signal pre-distortion unit 106 based on the control signal 117 from the control unit 102. The set of digital voltage levels is constant and the signal pre-distortion unit 106 in the transceiver assumes only constant voltage levels.

When the set of supply voltage levels to the power amplifier need to be changed, the transmission might be disturbed, e.g. causing an increased error vector magnitude (EVM). This is often not desired in some systems, such as a long-term evolution (LTE) system. Simply changing the set of supply voltages to the power amplifier, e.g. at the subframe boundary of LTE, can corrupt RF signal performance figures such as EVM and may lead to a drop of a complete frame. As a voltage level change may be needed frequently e.g. due to power changes, this is not an acceptable strategy. A simple acceleration of the switching speed from one set of voltages to another would not be possible because faster switching would require a higher current to recharge the associated capacitors. This would require a bigger coil (PCB area disadvantage) and bigger power stage transistors in the voltage regulator chip (larger chip area, reduced efficiency, etc.). In addition, faster switching usually comes with overshoots and ringing. This will degrade the RF errors even more.

BRIEF DESCRIPTION OF THE FIGURES

Some examples of apparatuses and/or methods will be described in the following by way of example only, and with reference to the accompanying figures, in which FIG. 1 shows conventional digital envelope tracking based on constant voltage levels;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are disclosed for digital envelope tracking with a dynamically changing set of voltage levels for a power amplifier. In the examples, the supply voltages from the power management IC to a power amplifier may change rapidly from a first set of voltages to a second set of voltages to maintain optimum efficiency for all use cases, and the system may run during such voltage change without interruption.

Figure 2:
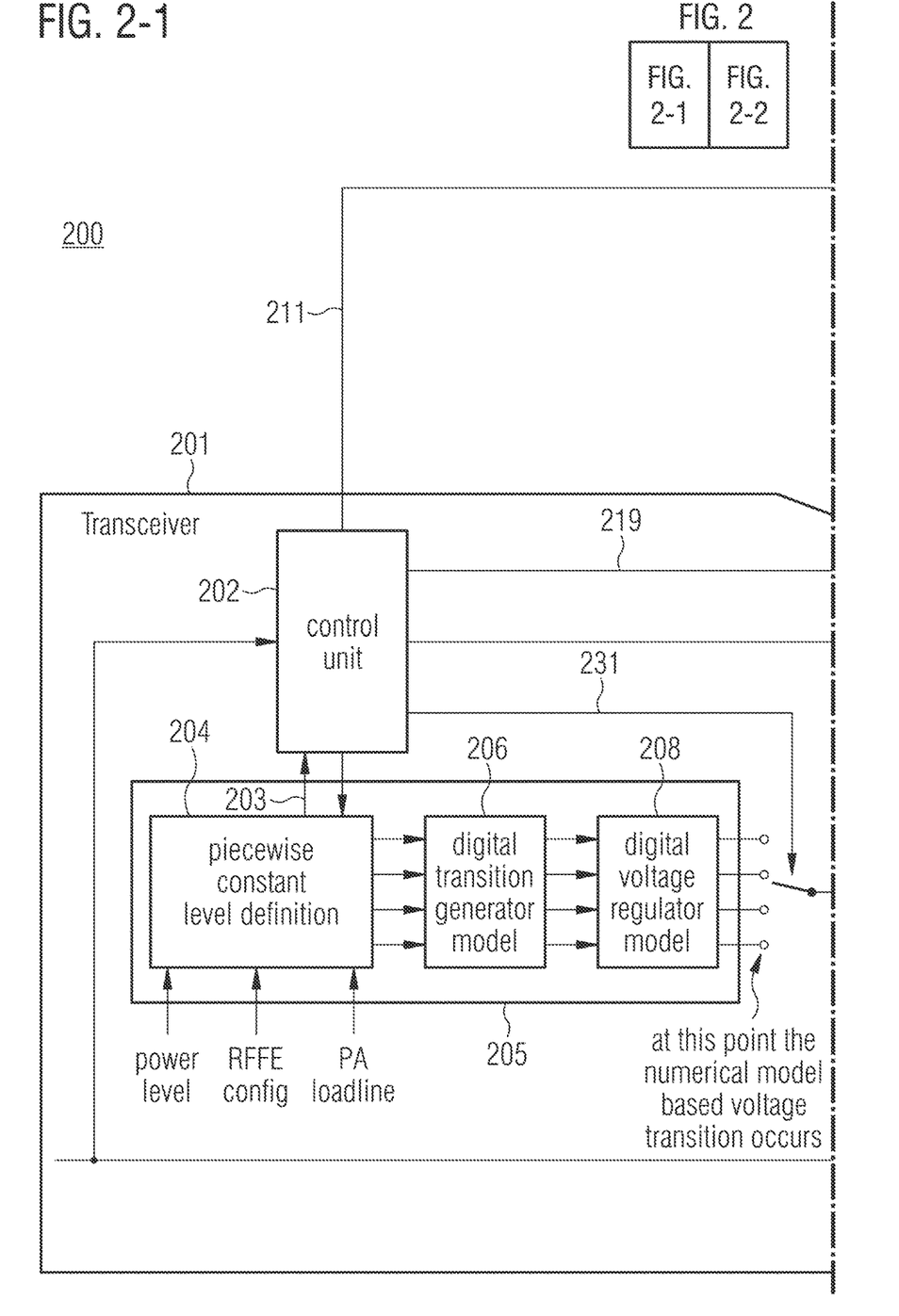
FIG. 2 shows an example device for digital envelope tracking with dynamically changing supply voltage levels.
Figure 4:
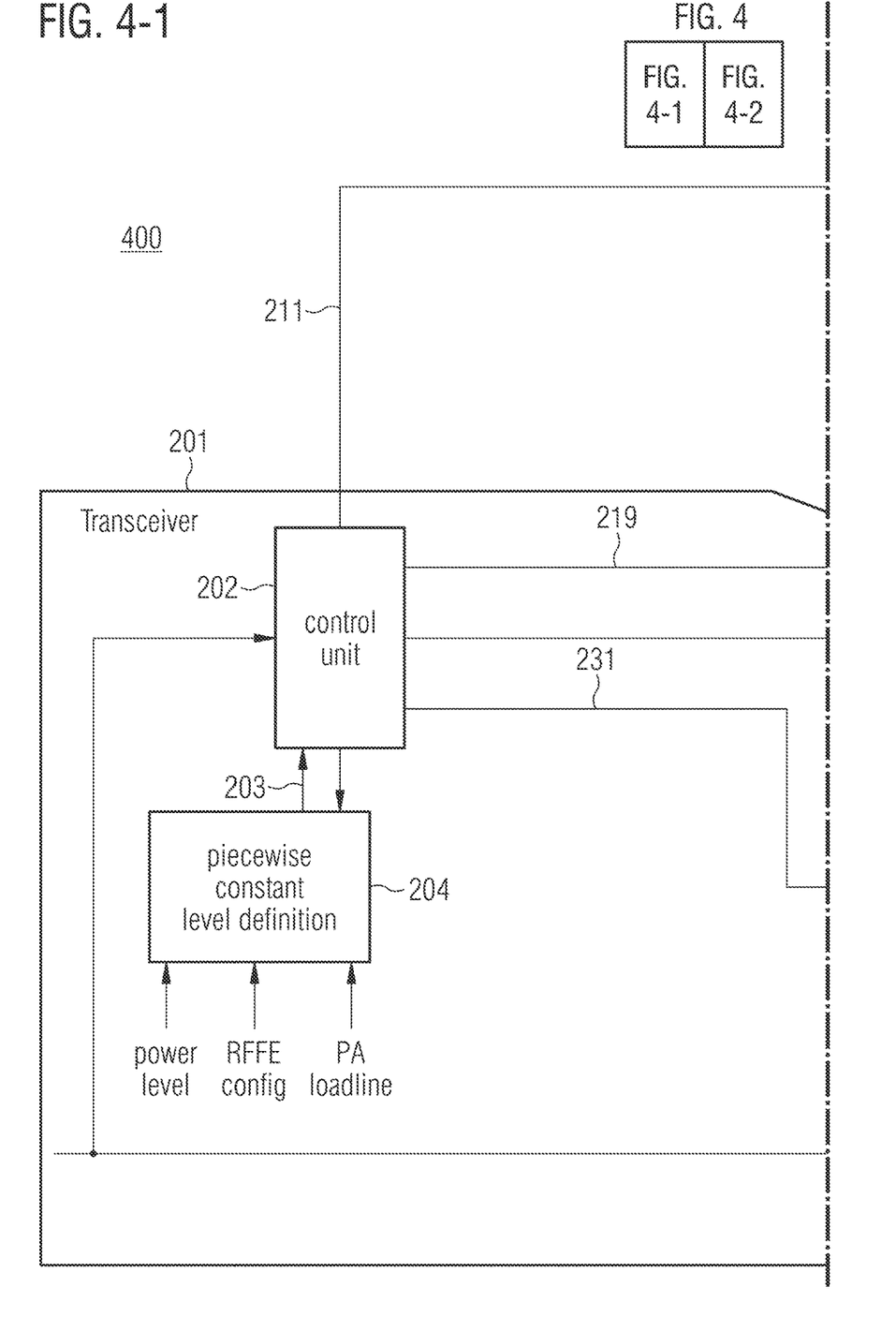
FIG. 4 shows an alternative example device for digital envelope tracking with dynamically changing supply voltage levels.

FIG. 2 shows an example device 200 for digital envelope tracking with dynamically changing supply voltage levels. The device 200 may be a wireless communication device. For example, the device 200 may be a UE as shown in FIG. 4. The device 200 may include a transceiver 201, a power management IC 210, and an RF power amplifier 220, and may also include other components for operations of the device 200. The power management IC 210 and the transceiver 201 may be separate semiconductor devices (such as different semiconductor chips or modules), or alternatively may be integrated into one device.

The transceiver 201 receives an input (IQ or polar) data stream 230 for transmission and performs pre-distortion on the input data stream 230 before sending it to the RF power amplifier 220. A control unit 202 in the transceiver 201 analyzes the characteristics of the input data stream 230 (such as the number and height of the peaks of the envelope of the input data stream 230) during each of specific time intervals and sends control signals 219, 231 for selecting one of the set of supply voltages for the RF power amplifier 220 and one of a set of digital voltage levels for the RF signal pre-distortion unit 209, respectively, which will be explained in detail below. The piecewise constant generator 212 outputs a signal(s) for target voltage based on the control signal 211, and a setpoint generator 214 imposes a gradual transition on the target voltage, i.e., the target voltage output from the setpoint generator 214 gradually increases or decreases to a new target voltage. The setpoint generator 214 may increase or decrease the target voltage step by step or continuously. For example, the set point generator 214 may increase or decrease the target voltage linearly (e.g. ramping up or down). Alternatively, the setpoint generator 214 may increase or decrease the target voltage exponentially. The setpoint generator 214 may gradually increase or decrease the target voltage according to a non-linear or piecewise linear continuous function. The set point generator 214 may start increasing or decreasing the target voltage with or without an initial step. The set-point generator 214 steers a voltage regulator 218 in the voltage converter 216 such that the set of supply voltages output from the voltage converter 216 changes in a controlled, deterministic, and reproducible way.

The voltage converter 216 (e.g. a SIMO DC-DC converter) generates a set of supply voltages based on the target voltage(s). As the target voltage gradually transitions from one level to another, the set of supply voltages generated by the voltage converter 216 also gradually changes from one set of voltages to another set of voltages. The set-point generator 214 triggers a transition from a first set of supply voltages to a second set of supply voltages e.g. by applying a control signal (e.g. a ramping up/down signal) to the voltage regulator 218. One of the set of supply voltages is switched by a switch 217 to a power amplifier 220 based on the control signal 219 from the control unit 202. In the examples, the physical voltage transition occurs at the output of the voltage converter 216.

One of the set of supply voltages is supplied to the PA core, for example depending on the PA load-line. The reconfiguration of the set of supply voltages is triggered by the set-point generator 214. For example, if a higher supply voltage can be supplied from the current set of supply voltages, the voltage may be switched from the current set of supply voltages. If a higher supply voltage cannot be supplied from the current set of supply voltages, the set of supply voltages may be reconfigured by the set-point generator 214 based on the control signal 211.

The transceiver 201 includes a digital voltage level generator 205 for generating a set of digital voltage levels for the RF signal pre-distortion unit 209 while replicating the behavior of the setpoint generator 214 and the voltage regulator 218 in the power management IC 210. In some examples, the voltage converter 216 and the digital voltage level generator 205 may be located in different semiconductor devices such as different chips or different modules. The transition of the replicated set of digital voltage levels is in synchronization with the supply voltage transition at the output of the voltage converter 216.

The piecewise constant level definition unit 204 receives information regarding the configured mode of the RF front end (RFFE), information regarding the power level of the input data stream to be transmitted, and configuration and calibration information such as the PA loadline, or the like, and derives the voltage levels for the set of supply voltages needed for the power amplifier 220 based on this information. The piecewise constant level definition unit 204 defines each voltage value of the set of supply voltages and this information (the control signal 211) is sent to the PMIC 210 via the control unit 203. The information sent in the control signal 211 from the piecewise constant level definition unit 204 may include the values to which the supply voltage levels need to be scaled as well as timing information regarding when to scale and/or with which speed to scale. A set of constant digital voltage levels is also output from the piecewise constant level definition unit 204 to the digital transition generator model unit 206. The scheduler for triggering the supply voltage levels transition may be in the control unit 202 or in the piecewise constant level definition unit 204. The control unit 202 may send a control signal including the trigger time information to the piecewise constant level definition unit 204. Alternatively, the control signal may be sent from the piecewise constant level definition unit 204 to the control unit 202.

In examples, digital models for replicating the behaviors of the setpoint generator 214 and the voltage regulator 218 may be added in the transceiver 201. The digital transition generator model unit 206 and the digital voltage regulator model unit 208 calculate (in the sense of model-based control) the exact transient behaviors of the physical voltage levels imposed by the setpoint generator 214 and the voltage regulator 218 in the power management IC 210, respectively. The digital transition generator model unit 206 gradually increases or decreases the set of constant digital voltage levels generated by the piecewise constant level definition unit 204 by replicating a behavior of the set point generator 214. The voltage regulator model unit 208 converts outputs of the digital transition generator model unit 206 into the set of digital voltage levels by replicating a behavior of the voltage regulator 216. The setpoint signal(s) (i.e., the constant digital voltage level(s) that may be a single signal or multiple signals) generated by the piecewise constant voltage level definition unit 204 are shaped by the digital transition generator model unit 206. The resulting signal from the digital transition generator model unit 206 is not piecewise constant anymore but may have a continuous transition. This signal(s) from the digital transition generator model unit 206 is then forwarded to the voltage regulator model unit 208 which adds the dynamic behavior of the voltage regulator 218 to the signal(s). The voltage regulator model unit 208 provides the full set of digital voltage levels which correspond to the physical voltage levels at the voltage converter 216. A dominant time constant or a transition time in the digital transition generator model unit 206 may be larger than a slowest dynamic process of the voltage regulator 218.

The set of supply voltages is constant for certain time intervals. The time intervals may be an LTE subframe, an LTE slot, one OFDM symbol, several OFDM symbols, or any other time duration. The set of supply voltages may change from one set of levels to another set of levels at the boundary of the time intervals. The piecewise constant level definition unit 204 calculates these changes of voltages, (i.e. calculates the desired steady state voltage levels during a time interval), and the setpoint generator 214 in the power management IC 210 and the digital transition generator model unit 206 and the digital voltage regulator model unit 208 shape the transition from one set of levels to another set in a defined and controlled way, instead of abrupt changes. After processing by the set point generator 214 and the digital transition generator model unit 206, the voltage level representation is not piecewise constant anymore and this transient behavior is taken into account for the RF signal predistortion.

The digital voltage levels calculated based on the numerical model transitions at the output of the digital voltage regulator model unit 208. The digital transition generator model unit 206 and the digital voltage regulator model unit 208 may be hardware circuits with a logic to calculate the same voltage changes imposed by the setpoint generator 214 and the voltage regulator 218 in the power management IC 210, respectively. Alternatively, the digital transition generator model unit 206 and the digital voltage regulator model unit 208 may be implemented by software.

One of the set of digital voltage levels which may change dynamically is switched to the RF signal pre-distortion unit 209 based on a control signal 231 from the control unit 202. The control unit 202 may derive the control signals 231 and 219 based on the undistorted (IQ or polar) data stream 230. The RF signal pre-distortion unit 209 modifies the undistorted input data stream 230 based on the power amplifier model parameters, supply filter model parameters, the digital voltage level, and the digital voltage level switched based on a control signal from the control unit 202. The RF signal pre-distortion unit 209 uses the instantaneous voltage levels instead of the constant voltage levels for its RF signal pre-distortion. With the digital transition generator model unit 206 and the digital voltage regulator model unit 208, the voltage level changes may be performed in a deterministic way and the transients of the supply voltage level changes are known to the RF signal pre-distortion unit 209. With this scheme, the RF signal pre-distortion unit 209 may work with the dynamically changing voltage levels instead of constant voltage levels.

The selection of the supply voltage levels for a power amplifier 220 is given by the power amplifier load line and the target output power in the next time interval (e.g. an upcoming sub-frame in case of LTE). A higher power amplifier load line requires a higher power amplifier supply voltage to achieve the maximum transmit power. This means that the (absolute) maximum voltage level depends on the power amplifier load line and may vary from transmit frequency band to transmit frequency band if different power amplifier cores are used to support different frequency bands. The target output power in next time interval sets the maximum voltage level in that time interval. The higher the target power the higher the maximum voltage in the set of the predefined supply voltage levels.

If the supply voltage levels do not fit to the power amplifier load line or the target power in the next time interval, the power amplifier efficiency is reduced since the power amplifier supply voltage headroom would be too high. In the examples disclosed herein, for optimum efficiency the set of supply voltage levels (especially the maximum voltage of the set) may be adapted during operation depending on the frequency band (i.e. the power amplifier core dedicated to the frequency band) and the target power.

The adaptation depending on the transmit frequency band may be less time critical since for a frequency band change some lead time may be given for reconfiguration. A target power change is more time critical since it may occur in a short period of time, for example between sub-frames in case of LTE. The acceptable settling time to change from a first set of voltage levels selected for a first target power to a second set of voltage levels selected for a second target power is typically short, (e.g. less than 5 µs).

In the examples, the supply voltages may be changed in a controlled and defined way. The supply voltages may be changed gradually and slowly. The setpoint generator 214 modifies the target voltage for the voltage regulator 218 with such a speed that the supply voltages are output without overshoots or ringing, and the speed is such that the RF signal pre-distortion unit 209 in the transceiver 201 may have enough time to interpolate between the parameters defined for certain fixed voltages.

The power amplifier load line normally imposes a more static condition since it does not change on a sub-frame basis unless a power amplifier with a switchable power amplifier matching is used. In some examples, the device 200 may include multiple power amplifier cores with different load lines and may activate and use multiple power amplifier cores in parallel, for example for inter-band uplink or downlink carrier aggregation (CA). Inter-band CA means that transmissions occur on two or more frequency bands simultaneously. Each power amplifier core may be dedicated to a different frequency band for concurrent operations and one of the set of supply voltages generated by the voltage converter 216 may be supplied to each of the power amplifier cores. For example, the device 200 may include at least two power amplifier cores, and one of the set of supply voltages may be supplied to a first power amplifier core via a first selector/switch and one of the set of supply voltages may be supplied to a second power amplifier via a second selector/switch. The first and the second power amplifier cores may be activated in parallel and be dedicated to different frequency bands.

The power amplifier cores may have different load lines forcing different maximum voltage levels. In this case the power amplifier core with the highest load line may be gating (i.e. the set of supply voltages may be generated based on the power amplifier core with the highest load line). In inter-frequency band CA operation, it may happen that one frequency band is blanked for a certain time, which means that there is no transmission in one frequency band. It may happen on a subframe basis in LTE. If a power amplifier core with the highest load line is blanked then the maximum voltage may not be optimum any more since the still active power amplifier core(s) may allow a lower maximum voltage. Without adaptation, the higher supply voltage may introduce too much headroom for the power amplifier cores, which degrades the power amplifier efficiency. The blanking of a power amplifier core may introduce a time critical event since it may happen on a sub-frame basis. In examples, the control unit 202 may dynamically adjust the target voltage and therefore the supply voltages if one or more power amplifier core(s) is switched on or off. The control unit 202 may also adjust the target voltage if a power level of at least one of the power amplifier cores is changed. With dynamic adaptation of the supply voltages for the power amplifier in accordance with the examples disclosed, more efficient operation of the power amplifier is achieved.

Figure 3:
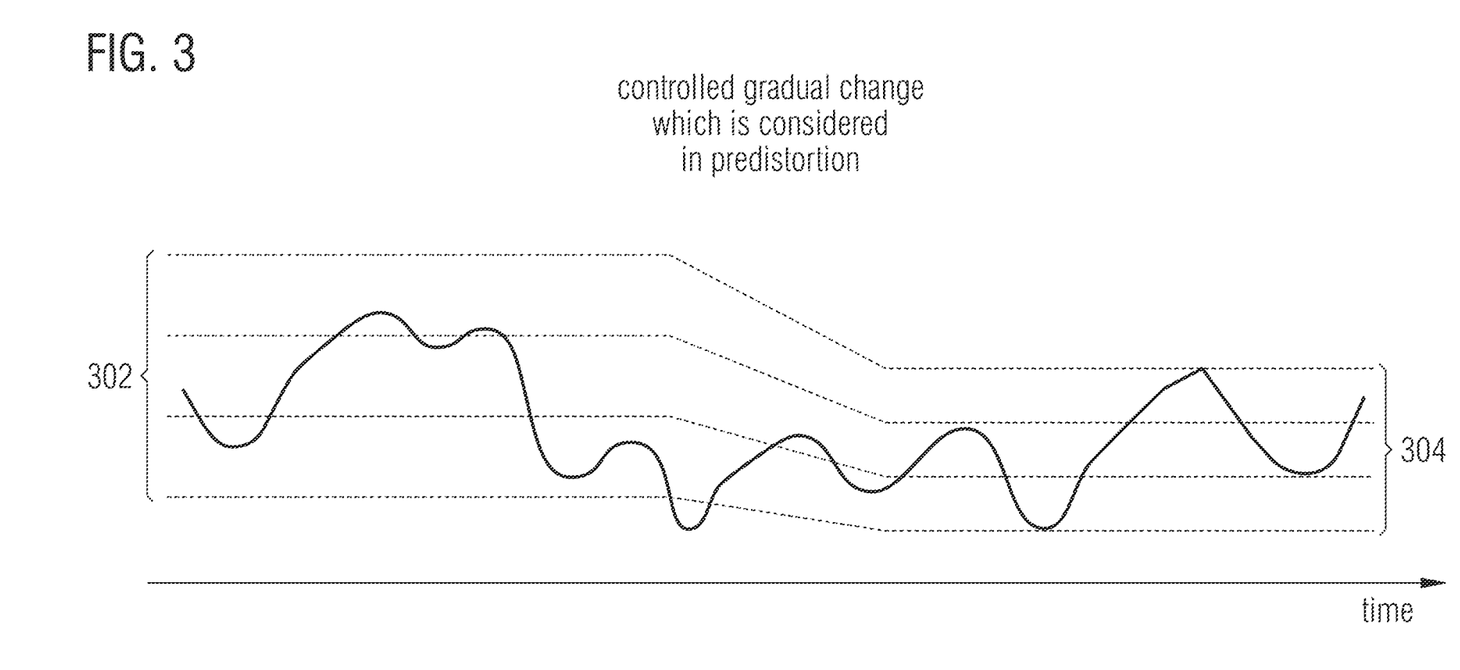
FIG. 3 shows an example of voltage level transition.

FIG. 3 shows an example of transition of supply voltages. As shown in FIG. 3, a gradual transition of the supply voltages occurs from a first set of voltage levels 302 to a second set of voltage levels 304 without ringing or overshooting. The RF signal pre-distortion unit 209 may utilize this instantaneous voltage level during transition for its signal pre-conditioning.

In one example, the voltage scaling (i.e. transition) may be performed, in case of voltage level increase, before the end of a frame, subframe, slot, or symbol boundary or any other time unit used in the communication system so that voltages may be scaled up to facilitate higher power transmission in the next time period. In another example, the voltage scaling may be performed, in case of voltage level decrease, at the beginning of a new frame, subframe, slot, or symbol boundary or any other time unit used in the communication system. High power transmission is maintained until the end of the previous time period, and in the following time period, voltages may be lowered slowly and gradually to the new target level. In another example, the voltage scaling may be performed anywhere in a frame, subframe, slot, or symbol or any other time unit used in the communication system (e.g. in the middle of a frame, subframe, slot, or symbol, or the like). This may be applied for instance in case of carrier aggregation or dual-subscriber identity module (SIM) dual-active cases where two or more asynchronous links may exist.

The conventional digital envelope tracking may not be used for mobile applications or may need to run with the highest set of voltage levels, which leads to lower efficiency. The supply voltage scaling according to the examples disclosed herein may work for mobile applications since the supply voltages may be adjusted dynamically at any point in time without harming the envelop tracking or RF performances. As the RF signal pre-distortion unit considers the instantaneous voltage changes, no major errors may occur in the output signal.

FIG. 4 shows an alternative example device 400 for digital envelope tracking with dynamically changing supply voltage levels. The device 400 is same as the device 200 in FIG. 2, except that an analog-to-digital converter (ADC) 250 is used, instead of the digital transition generator model unit 206 and the digital voltage regulator model unit 208 in FIG. 2, for generating a set of digital voltage levels corresponding to the set of supply voltages output from the voltage converter 216. The ADC 250 may track the output voltage of the voltage converter 216 to provide the instantaneous PA supply voltage as an infeed to the RF signal pre-distortion unit 209. The ADC 250 may be included either in the power management IC 210 or in the transceiver 200. The ADC 250 may measure one of the set of supply voltages, or more than one or all of the set of supply voltages, or a combination of two or more of the set of supply voltages, and send one or a set of digital voltage levels to the RF signal pre-distortion unit 209.

Figure 5:
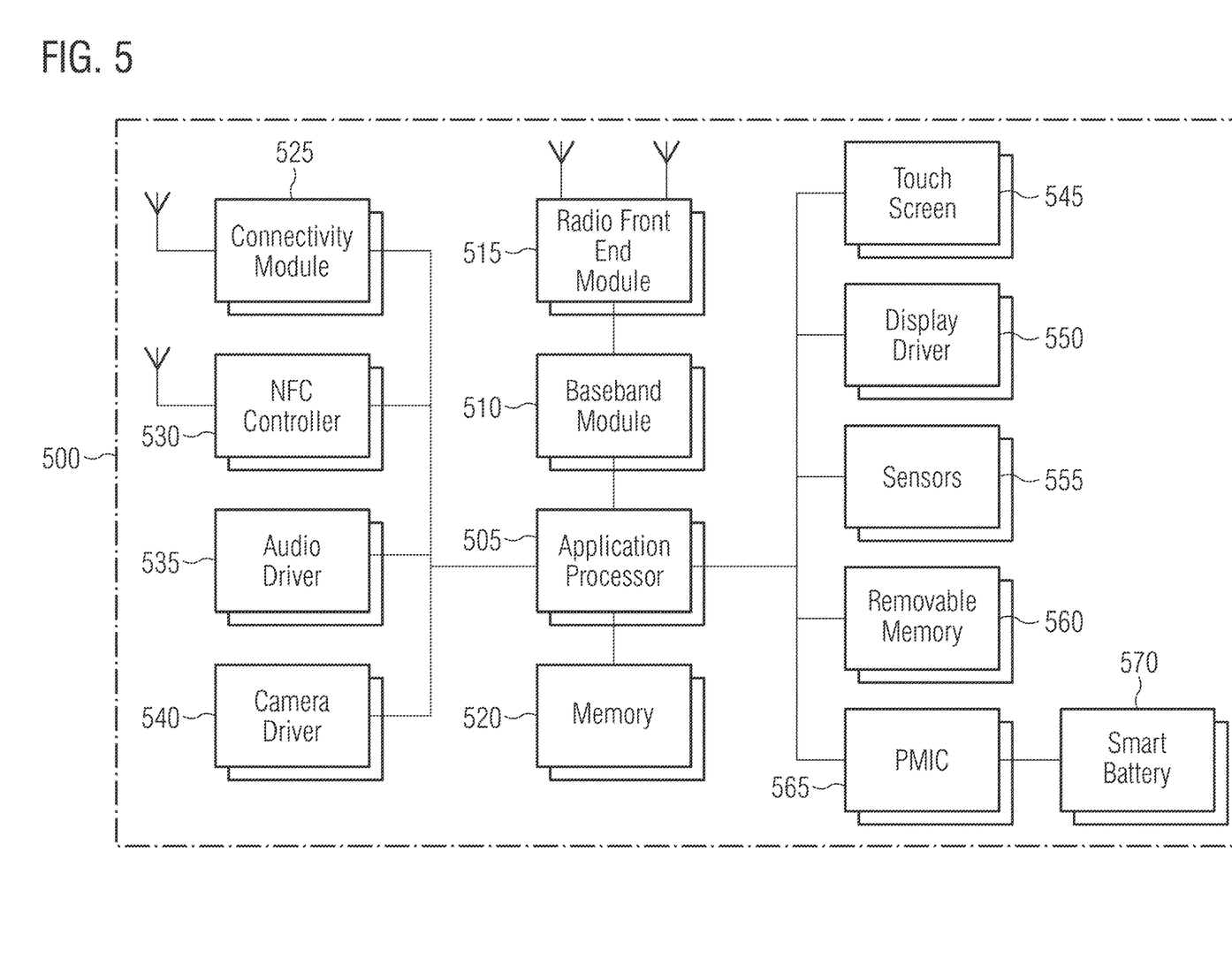
FIG. 5 illustrates an example user equipment (UE) in accordance with one aspect.

FIG. 5 illustrates an example UE 500 (e.g. a wireless communication device) in accordance with one aspect. The UE 500 may be a mobile device in some aspects and includes an application processor 505, a baseband processor 510 (also referred to as a baseband module), a radio front end module (RFEM) 515, memory 520, a connectivity module 525, a near field communication (NFC) controller 530, an audio driver 535, a camera driver 540, a touch screen 545, a display driver 550, sensors 555, removable memory 560, power management integrated circuit (PMIC) 565, a smart battery 570, etc.

In some aspects, the application processor 505 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, the baseband module 510 may be implemented, for example, as a solder-down substrate including one or more integrated circuits, a single packaged integrated circuit soldered to a main circuit board, and/or a multi-chip module containing two or more integrated circuits.

The UE 500 may communicate with a base station over a radio link. Any of the radio links between the UE 500 and the base station may operate according to any one or more of the following radio communication technologies and/or standards including, but not limited to: a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology, for example Universal Mobile Telecommunications System (UMTS), Freedom of Multimedia Access (FOMA), 3GPP Long Term Evolution (LTE), 3GPP Long Term Evolution Advanced (LTE Advanced), Code division multiple access 2000 (CDMA2000), Cellular Digital Packet Data (CDPD), Mobitex, Third Generation (3G), Circuit Switched Data (CSD), High-Speed Circuit-Switched Data (HSCSD), Universal Mobile Telecommunications System (Third Generation) (UMTS (3G)), Wideband Code Division Multiple Access (Universal Mobile Telecommunications System) (W-CDMA (UMTS)), High Speed Packet Access (HSPA), High-Speed Downlink Packet Access (HSDPA), High-Speed Uplink Packet Access (HSUPA), High Speed Packet Access Plus (HSPA+), Universal Mobile Telecommunications System-Time-Division Duplex (UMTS-TDD), Time Division-Code Division Multiple Access (TD-CDMA), Time Division-Synchronous Code Division Multiple Access (TD-CDMA), 3rd Generation Partnership Project Release 8 (Pre-4th Generation) (3GPP Rel. 8 (Pre-4G)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17), 3GPP Rel. 18 (3rd Generation Partnership Project Release 18), 3GPP 5G, 3GPP LTE Extra, LTE-Advanced Pro, LTE Licensed-Assisted Access (LAA), MuLTEfire, UMTS Terrestrial Radio Access (UTRA), Evolved UMTS Terrestrial Radio Access (E-UTRA), Long Term Evolution Advanced (4th Generation) (LTE Advanced (4G)), cdmaOne (2G), Code division multiple access 2000 (Third generation) (CDMA2000 (3G)), Evolution-Data Optimized or Evolution-Data Only (EV-DO), Advanced Mobile Phone System (1st Generation) (AMPS (1G)), Total Access Communication System/Extended Total Access Communication System (TACS/ETACS), Digital AMPS (2nd Generation) (D-AMPS (2G)), Push-to-talk (PTT), Mobile Telephone System (MTS), Improved Mobile Telephone System (IMTS), Advanced Mobile Telephone System (AMTS), OLT (Norwegian for Offentlig Landmobil Telefoni, Public Land Mobile Telephony), MTD (Swedish abbreviation for Mobiltelefonisystem D, or Mobile telephony system D), Public Automated Land Mobile (Autotel/PALM), ARP (Finnish for Autoradiopuhelin, "car radio phone"), NMT (Nordic Mobile Telephony), High capacity version of NTT (Nippon Telegraph and Telephone) (Hicap), Cellular Digital Packet Data (CDPD), Mobitex, DataTAC, Integrated Digital Enhanced Network (iDEN), Personal Digital Cellular (PDC), Circuit Switched Data (CSD), Personal Handy-phone System (PHS), Wideband Integrated Digital Enhanced Network (WiDEN), iBurst, Unlicensed Mobile Access (UMA), also referred to as also referred to as 3GPP Generic Access Network, or GAN standard), Zigbee, Bluetooth®, Wireless Gigabit Alliance (WiGig) standard, mmWave standards in general (wireless systems operating at 10-300 GHz and above such as WiGig, IEEE 802.11ad, IEEE 802.11ay, etc.), IEEE 802.11 standards in general including 802.11a, 802.11b, 802.11g, 802.11n, and 802.11ac, technologies operating above 300 GHz and THz bands, (3GPP/LTE based or IEEE 802.11p and other) Vehicle-to-Vehicle (V2V) and Vehicle-to-X (V2X) communication technologies, DSRC (Dedicated Short Range Communications) communication systems such as Intelligent-Transport-Systems and others, etc.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a device for digital envelope tracking with dynamically changing voltage levels. The device comprises a power management unit for generating a set of supply voltages for a power amplifier based on a control signal. The power management unit comprises a voltage converter including a voltage regulator for generating the set of supply voltages based on a target voltage, and a setpoint generator for gradually increasing or decreasing the target voltage from a first level to a second level such that the set of supply voltages gradually increase or decrease from a first set of voltages to a second set of voltages in response to a gradual transition of the target voltage. The device also comprises a digital voltage level generator for determining voltage levels of the set of supply voltages and generating a set of digital voltage levels corresponding to the set of supply voltages, wherein the control signal is generated based on the voltage levels for the set of supply voltages. The device also comprises a control unit for determining characteristics of an input data stream and generate control signals for selecting one of the set of supply voltages and one of the set of digital voltage levels, and a signal pre-distortion unit for distorting the input data stream based on a digital voltage level selected among the set of digital voltage levels.

Example 2 is the device of example 1, wherein the digital voltage level generator comprises a piecewise constant voltage level generator for determining the voltage levels of the set of supply voltages and generating a set of constant digital voltage levels based on the voltage levels, a transition generator model unit for gradually increasing or decreasing the set of constant digital voltage levels by replicating a behavior of the setpoint generator, and a voltage regulator model unit for converting outputs of the transition generator model unit into the set of digital voltage levels by replicating a behavior of the voltage regulator.

Example 3 is the device of example 2, wherein the setpoint generator gradually increases or decreases the target voltage step by step.

Example 4 is the device of example 2, wherein the setpoint generator increases or decreases the target voltage exponentially.

Example 5 is the device of example 2, wherein the setpoint generator gradually increases or decreases the target voltage according to a non-linear or piecewise linear continuous function.

Example 6 is the device of example 2, wherein a dominant time constant or a transition time in the transition generator model unit is larger than a slowest dynamic process of the voltage regulator.

Example 7 is the device of example 1, wherein the set of supply voltages is supplied to a plurality of power amplifier cores that are active in parallel and are dedicated to different frequency bands.

Example 8 is the device of example 7, wherein the control unit is configured to adjust the target voltage if at least one of the power amplifier cores is switched on or off.

Example 9 is the device of example 7, wherein the control unit is configured to adjust the target voltage if a power level of at least one of the power amplifier cores is changed.

Example 10 is the device as in any one of examples 1-9, wherein a transition of the set of supply voltages occurs before or after a frame, subframe, slot, or symbol boundary.

Example 11 is the device as in any one of examples 1-9, wherein a transition of the set of supply voltages occurs in a middle of a frame, subframe, slot, or symbol.

Example 12 is the device as in any one of examples 1-9, wherein the set of digital voltage levels corresponding to the set of supply voltages output from the voltage converter is generated by an analog-to-digital converter.

Example 13 is the device as in any one of examples 1-9, wherein the voltage converter and the digital voltage level generator are located in different semiconductor devices.

Example 14 is a wireless communication device for digital envelope tracking with dynamically changing voltage levels. The wireless communication device comprises a power management IC for generating a set of supply voltages and outputting one of the set of supply voltages to a power amplifier based on a control signal. The power management IC comprises a voltage converter including a voltage regulator for generating the set of supply voltages based on a target voltage, and a setpoint generator for gradually increasing or decreasing the target voltage from a first level to a second level such that the set of supply voltages gradually increase or decrease from a first set of voltages to a second set of voltages in response to a gradual transition of the target voltage. The wireless communication device includes a transceiver for transmitting an input data stream. The transceiver comprises a digital voltage level generator for determining voltage levels of the set of supply voltages and generating a set of digital voltage levels corresponding to the set of supply voltages, wherein the control signal is generated based on the voltage levels for the set of supply voltages, a control unit for determining characteristics of the input data stream and generating control signals for selecting one of the set of supply voltages and one of the set of digital voltage levels, and a signal pre-distortion unit for pre-conditioning the input data stream based on a digital voltage level selected among the set of digital voltage levels, and the power amplifier for generating an RF signal based on the distorted input data stream.

Example 15 is the wireless communication device of example 14, wherein the digital voltage level generator comprises a piecewise constant voltage level generator for determining the voltage levels of the set of supply voltages and generating a set of constant digital voltage levels based on the voltage levels, a transition generator model unit for gradually increasing or decreasing the set of constant digital voltage levels by replicating a behavior of the setpoint generator, and a digital voltage regulator model unit for converting outputs of the transition generator model unit for generating the set of digital voltage levels by replicating a behavior of the voltage regulator.

Example 16 is the wireless communication device of example 15, wherein the setpoint generator gradually increases or decreases the target voltage step by step.

Example 17 is the wireless communication device of example 15, wherein the setpoint generator increases or decreases the target voltage exponentially.

Example 18 is the wireless communication device of example 15, wherein the setpoint generator gradually increases or decreases the target voltage according to a non-linear or piecewise linear continuous function.

Example 19 is the wireless communication device of example 15, wherein a dominant time constant or a transition time in the transition generator model unit is larger than a slowest dynamic process of the voltage regulator.

Example 20 is the wireless communication device as in any one of examples 14-19, wherein the power amplifier includes a plurality of power amplifier cores and the set of supply voltages is supplied to the plurality of power amplifier cores that are active in parallel and are dedicated to different frequency bands.

Example 21 is the wireless communication device of example 20, wherein the control unit is configured to adjust the target voltage if at least one of the power amplifier cores is switched on or off.

Example 22 is the wireless communication device of example 20, wherein the control unit is configured to adjust the target voltage if the power level of at least one of the power amplifier cores is changed.

Example 23 is the wireless communication device as in any one of examples 14-19, wherein a transition of the set of supply voltages occurs before or after a frame, subframe, slot, or symbol boundary.

Example 24 is the wireless communication device as in any one of examples 14-19, wherein a transition of the set of supply voltages occurs in a middle of a frame, subframe, slot, or symbol.

Example 25 is the wireless communication device as in any one of examples 14-19, wherein the set of digital voltage levels corresponding to the set of supply voltages output from the voltage converter is generated by an analog-to-digital converter.

Example 26 is the wireless communication device as in any one of examples 14-19, wherein the voltage converter and the digital voltage level generator are located in different semiconductor devices.

Example 27 is a method for digital envelope tracking with dynamically changing voltage levels. The method comprises determining characteristics of an input data stream, sending a control signal to a power management unit based on the characteristics of the input data stream, generating a target voltage by a setpoint generator, wherein the target voltage gradually increases or decreases from a first level to a second level, generating a set of supply voltages by a voltage converter based on the target voltage, wherein the set of supply voltages gradually increase or decrease from a first set of voltages to a second set of voltages in response to a gradual transition of the target voltage, generating a set of digital voltage levels corresponding to the set of supply voltages, pre-conditioning the input data stream based on a digital voltage level selected among the set of digital voltage levels, and supplying one of the set of supply voltages to a power amplifier.

Example 28 is the method of example 27, wherein the set of digital voltage levels is generated by generating a set of constant digital voltage levels based on voltage levels of the set of supply voltages, gradually increasing or decreasing the set of constant digital voltage levels by replicating a behavior of the setpoint generator, and generating the set of digital voltage levels by replicating a behavior of a voltage regulator in the voltage converter.

Example 29 is the method of example 28, wherein the target voltage is increased or decreased step by step according to a predefined transition shaping function.

Example 30 is the method of example 28, wherein the setpoint generator increases or decreases the target voltage exponentially.

Example 31 is the method of example 28, wherein the setpoint generator gradually increases or decreases the target voltage according to a non-linear or piecewise linear continuous function.

Example 32 is the method as in any one of examples 27-31, wherein one of the set of supply voltages is supplied to a first power amplifier core via a first selector and one of the set of supply voltages is supplied to a second power amplifier core via a second selector, wherein the first and second power amplifier cores are active in parallel and are dedicated to different frequency bands.

Example 33 is the method of example 32, further comprises adjusting the target voltage if at least one of the power amplifier cores is switched on or off or if a power level of at least one of the power amplifier cores is changed.

Example 34 is the method as in any one of examples 27-31, wherein a transition of the set of supply voltages occurs before or after a frame, subframe, slot, or symbol boundary.

Example 35 is the method as in any one of examples 27-31, wherein a transition of the set of supply voltages occurs in a middle of a frame, subframe, slot, or symbol.

Example 36 is a device for digital envelope tracking with dynamically changing voltage levels. The device comprises means for gradually increasing or decreasing a target voltage from a first level to a second level based on a control signal, means for generating a set of supply voltages for a power amplifier based on the target voltage such that the set of supply voltages gradually increase or decrease from a first set of voltages to a second set of voltages in response to a gradual transition of the target voltage, means for determining characteristics of an input data stream and generating the control signal based on voltage levels of the set of supply voltages, means for generating a set of digital voltage levels corresponding to the set of supply voltages, and means for distorting the input data stream based on a digital voltage level selected among the set of digital voltage levels.

Example 37 is the device of example 36, wherein the means for generating the set of digital voltage levels comprises means for generating a set of constant digital voltage levels based on the voltage levels of the supply voltages, and means for gradually increasing or decreasing the set of constant digital voltage levels by replicating a behavior of the means for generating the set of supply voltages.

Example 38 is the device of example 36, wherein the target voltage is increased or decreased step by step.

Example 39 is the device of example 36, wherein the target voltage is increased or decreased exponentially.

Example 40 is the device of example 36, wherein the target voltage is increased or decreased according to a non-linear or piecewise linear continuous function.

Example 41 is the device as in any one of examples 36-40, wherein the set of supply voltages is supplied to a plurality of power amplifier cores that are active in parallel and are dedicated to different frequency bands.

Example 42 is the device of example 41, wherein the target voltage is adjusted if at least one of the power amplifier cores is switched on or off.

Example 43 is the device of example 41, wherein the target voltage is adjusted if a power level of at least one of the power amplifier cores is changed.

Example 44 is the device as in any one of examples 36-40, wherein a transition of the set of supply voltages occurs before or after a frame, subframe, slot, or symbol boundary.

Example 45 is the device as in any one of examples 36-40, wherein a transition of the set of supply voltages occurs in a middle of a frame, subframe, slot, or symbol.

Example 46 is a machine-readable medium including code, when executed, to cause a machine to perform any of the methods in examples 27-35.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A device for digital envelope tracking with dynamically changing voltage levels, the device comprising:
    a power management unit for generating a set of supply voltages for a power amplifier based on a control signal, wherein the power management unit comprises:
    a voltage converter including a voltage regulator for generating the set of supply voltages based on a target voltage; and
    a setpoint generator for gradually increasing or decreasing the target voltage from a first level to a second level such that the set of supply voltages gradually increase or decrease from a first set of voltages to a second set of voltages in response to a gradual transition of the target voltage;
    a digital voltage level generator for determining voltage levels of the set of supply voltages and generating a set of digital voltage levels corresponding to the set of supply voltages, wherein the control signal is generated based on the voltage levels for the set of supply voltages;
    a control unit for determining characteristics of an input data stream and generate control signals for selecting one of the set of supply voltages and one of the set of digital voltage levels; and
    a signal pre-distortion unit for distorting the input data stream based on a digital voltage level selected among the set of digital voltage levels.

2. The device of claim 1, wherein the digital voltage level generator comprises:
    a piecewise constant voltage level generator for determining the voltage levels of the set of supply voltages and generating a set of constant digital voltage levels based on the voltage levels;
    a transition generator model unit for gradually increasing or decreasing the set of constant digital voltage levels by replicating a behavior of the setpoint generator; and
    a voltage regulator model unit for converting outputs of the transition generator model unit into the set of digital voltage levels by replicating a behavior of the voltage regulator.

3. The device of claim 2, wherein the setpoint generator gradually increases or decreases the target voltage step by step.

4. The device of claim 2, wherein the setpoint generator increases or decreases the target voltage exponentially.

5. The device of claim 2, wherein the setpoint generator gradually increases or decreases the target voltage according to a non-linear or piecewise linear continuous function.

6. The device of claim 2, wherein a dominant time constant or a transition time in the transition generator model unit is larger than a slowest dynamic process of the voltage regulator.

7. The device of claim 1, wherein the set of supply voltages is supplied to a plurality of power amplifier cores that are active in parallel and are dedicated to different frequency bands.

8. The device of claim 7, wherein the control unit is configured to adjust the target voltage if at least one of the power amplifier cores is switched on or off.

9. The device of claim 7, wherein the control unit is configured to adjust the target voltage if a power level of at least one of the power amplifier cores is changed.

10. The device as in any one of claims 1-9, wherein a transition of the set of supply voltages occurs before or after a frame, subframe, slot, or symbol boundary.

11. The device as in any one of claims 1-9, wherein a transition of the set of supply voltages occurs in a middle of a frame, subframe, slot, or symbol.

12. The device as in any one of claims 1-9, wherein the set of digital voltage levels corresponding to the set of supply voltages output from the voltage converter is generated by an analog-to-digital converter.

13. The device as in any one of claims 1-9, wherein the voltage converter and the digital voltage level generator are located in different semiconductor devices.

14. A method for digital envelope tracking with dynamically changing voltage levels, the method comprising:
    determining characteristics of an input data stream;
    sending a control signal to a power management unit based on the characteristics of the input data stream;
    generating a target voltage by a setpoint generator, wherein the target voltage gradually increases or decreases from a first level to a second level;
    generating a set of supply voltages by a voltage converter based on the target voltage, wherein the set of supply voltages gradually increase or decrease from a first set of voltages to a second set of voltages in response to a gradual transition of the target voltage;
    generating a set of digital voltage levels corresponding to the set of supply voltages; pre-conditioning the input data stream based on a digital voltage level selected among the set of digital voltage levels; and
    supplying one of the set of supply voltages to a power amplifier.

15. The method of claim 14, wherein the set of digital voltage levels is generated by:
    generating a set of constant digital voltage levels based on voltage levels of the set of supply voltages;

gradually increasing or decreasing the set of constant digital voltage levels by replicating a behavior of the setpoint generator; and generating the set of digital voltage levels by replicating a behavior of a voltage regulator in the voltage converter.

16. The method of claim 15, wherein the target voltage is increased or decreased step by step according to a predefined transition shaping function.

17. The method of claim 15, wherein the setpoint generator increases or decreases the target voltage exponentially.

18. The method of claim 15, wherein the setpoint generator gradually increases or decreases the target voltage according to a non-linear or piecewise linear continuous function.

19. The method of claim 14, wherein one of the set of supply voltages is supplied to a first power amplifier core via a first selector and one of the set of supply voltages is supplied to a second power amplifier core via a second selector, wherein the first and second power amplifier cores are active in parallel and are dedicated to different frequency bands;

wherein the method further comprises adjusting the target voltage when:
at least one of the power amplifier cores is switched on or off; or
a power level of at least one of the power amplifier cores is changed.

20. The method of claim 14, wherein a transition of the set of supply voltages occurs:
before a frame, subframe, slot, or symbol boundary;
after a frame, subframe, slot, or symbol boundary; or
in a middle of a frame, subframe, slot, or symbol.

* * * * *